United States Patent
Goodman et al.

(10) Patent No.: US 6,996,673 B2
(45) Date of Patent: Feb. 7, 2006

(54) METHOD AND APPARATUS FOR MANAGING INVENTORY AND DOOR STATUS DURING FIRMWARE UPDATE OF AN AUTOMATED DATA STORAGE LIBRARY

(75) Inventors: Brian G. Goodman, Tucson, AZ (US); Leonard G. Jesionowski, Tucson, AZ (US); Robin D. Roberts, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 344 days.

(21) Appl. No.: 10/646,652

(22) Filed: Aug. 21, 2003

(65) Prior Publication Data

US 2005/0044314 A1 Feb. 24, 2005

(51) Int. Cl.
 *G06F 12/02* (2006.01)
(52) U.S. Cl. .................................................. 711/114
(58) Field of Classification Search ................ 711/112, 711/114
See application file for complete search history.

(56) References Cited

U.S. PATENT DOCUMENTS

| | | | |
|---|---|---|---|
| 5,059,772 A | 10/1991 | Younglove | |
| 6,052,341 A | 4/2000 | Bingham et al. | |
| 6,216,057 B1 | 4/2001 | Jesionowski | |
| 6,286,079 B1 | 9/2001 | Basham et al. | |
| 6,782,448 B2 * | 8/2004 | Goodman et al. | 711/112 |
| 2004/0054883 A1 * | 3/2004 | Goodman et al. | 713/1 |
| 2005/0080964 A1 * | 4/2005 | Colvig et al. | 710/200 |

* cited by examiner

*Primary Examiner*—Kevin L. Ellis
(74) *Attorney, Agent, or Firm*—Law Office of Dan Shifrin, PC (57) ABSTRACT

An automated data storage library accesses data storage media from storage shelves in response to commands from an external host. The library receives and activates a firmware update in a processor node and determines whether a library door has been opened and/or closed during the code activation. Only if a library door has been opened and/or closed will an inventory of the storage media be performed.

19 Claims, 6 Drawing Sheets

Fig. 6

METHOD AND APPARATUS FOR MANAGING INVENTORY AND DOOR STATUS DURING FIRMWARE UPDATE OF AN AUTOMATED DATA STORAGE LIBRARY

FIELD OF THE INVENTION

The present invention relates generally to automated data storage libraries, and in particular, to minimizing disruption of library operations following a library code update.

BACKGROUND OF THE INVENTION

Automated data storage libraries provide a means for storing large quantities of data on data storage media that are not permanently mounted in data storage drives, and that are stored in a readily available form on storage shelves. One or more robot accessors retrieve selected data storage media from storage shelves and provide them to data storage drives. Typically, data stored on data storage media of an automated data storage library, once requested, is needed quickly. Thus, it is desirable that an automated data storage library be maintained in an operational condition as much as possible, such as the well known "24×7×365" availability.

Automated data storage libraries are typically operated by one or more processors, such as a central controller which interfaces with the host systems through an external interface and provides a constantly updated inventory of the locations of the data storage media within the library, and a robot control system which identifies precise locations of the data storage drives and the storage shelves and calculates the best operation of the robot accessor(s) to efficiently transport data storage media between the various storage shelves and data storage drives. The processors are run by program code, often called "firmware", since the code is related to the hardware constituting the library. Often, the firmware requires updating, for example, if a new or updated function or apparatus is provided to the library.

In order to maintain the customer expectations of the 24×7×365 availability, library firmware updates are expected to create minimum disruption to the normal operation of the library. One approach is to update the firmware in the background, as described in co-pending U.S. patent application Ser. No. 10/083,784 filed Feb. 23, 2002 entitled "Background Code Update For Embedded Systems", incorporated herein by reference. The library firmware is updated while performing normal operations. A problem with this approach is that activation of the new firmware disrupts normal library operation. This is because long inventory times may cause host commands to time out. Co-pending U.S. patent application Ser. No. 10/113,670 filed Apr. 2, 2002 entitled "Transparent Code Update In An Automated Data Storage Library", incorporated herein by reference, describes a method for reducing the disruption when activating the new firmware image. Prior to an update, the inventory is saved in nonvolatile memory or the operation is performed on an assumption that the inventory didn't change. Saving the inventory carries a risk that a door may have been opened and media locations changed during the reset and activation of the new firmware. Alternatively, assuming that the inventory hasn't changed may be a misplaced trust and carries the same risk. Either scenario may lead to the very failure which the system was designed to avoid in the first place.

Therefore, a need remains for improvements to the management of library inventory and door status during a firmware update.

SUMMARY OF INVENTION

In a first embodiment, a door sense circuit monitors door status during the activation of a firmware update. If no door has been opened, then there is no need to inventory the data storage media and a potentially disruptive inventory operation is avoided. If a door has been opened, then part or all of the library will be inventoried because data storage media may have been moved. While a re-inventory can be disruptive, in one embodiment it is performed only when necessary that is, only when it has been determined that data storage media may have been moved. In other embodiments, a re-inventory may be performed more frequently.

In a second embodiment, the library controller comprises more than one processor, such as described in U.S. Pat. No. 6,356,803, entitled Automated Data Storage Library Distributed Control System. In this embodiment, one or more of the processors maintain the inventory and/or monitor door status while the other processor(s) activate the new firmware update. The newly activated processor(s) then receive the inventory and/or door status from the other processor(s). The processor(s) that have not activated the new firmware update may then do so.

DETAILED DESCRIPTION OF THE INVENTION

Figure 1:
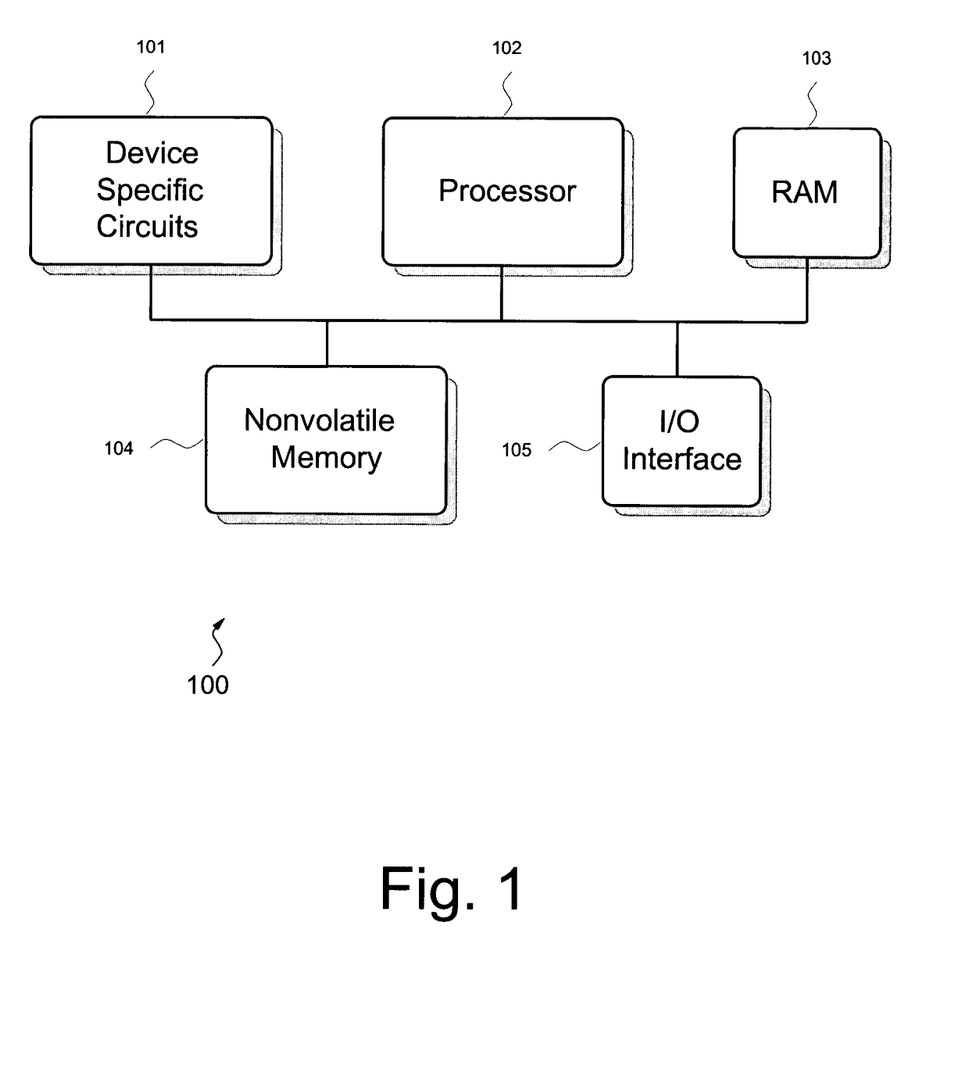
FIG. 1 illustrates a block diagram of a library controller in which the present invention may be implemented.

An automated data storage library typically contains one or more library controllers to direct the operation of the automated data storage library. The library controller may take many different forms and may comprise an embedded system, a distributed control system, a personal computer, workstation, etc. FIG. 1 illustrates a typical library controller 100 with a processor 102, RAM 103, nonvolatile memory 104, device specific circuits 101, and I/O interface 105. Alternatively, the RAM 103, the nonvolatile memory 104, the device specific circuits 101 and/or the I/O interface 105 may be integrated within the processor 102. The processor 102 may comprise an off the shelf microprocessor, a custom processor, a Field Programmable Gate Array (FPGA), an Application Specific Integrated Circuit (ASIC), discrete logic, etc. The RAM 103 is typically used to hold variable data, stack data, executable instructions, etc. The nonvolatile memory 104 may comprise any type of nonvolatile memory such as Electrically Erasable Programmable Read Only Memory (EEPROM), flash Programmable Read Only Memory (PROM), battery backup Random Access Memory (RAM), hard disk drive, etc. The nonvolatile memory 104 is typically used to hold the executable firmware and any nonvolatile data. The I/0 interface 105 is a communication interface which allows the processor 102 to communicate with devices external to the controller 100. Examples of an I/O interface include serial interfaces such as RS-232 or USB (Universal Serial Bus), SCSI (Small Computer Systems Interface), FC-AL (Fibre Channel-Arbitrated Loop), etc. The device specific circuits 101 provide additional hardware to enable the library controller 100 to perform unique functions such as motor control of a cartridge gripper, etc. The device specific circuits 101 may comprise electronics that provide Pulse Width Modulation (PWM) control, Analog to Digital Conversion (ADC), Digital to Analog Conversion (DAC), etc. in addition, all or part of the device specific circuits 101 may reside outside the library controller 100.

Figure 2:
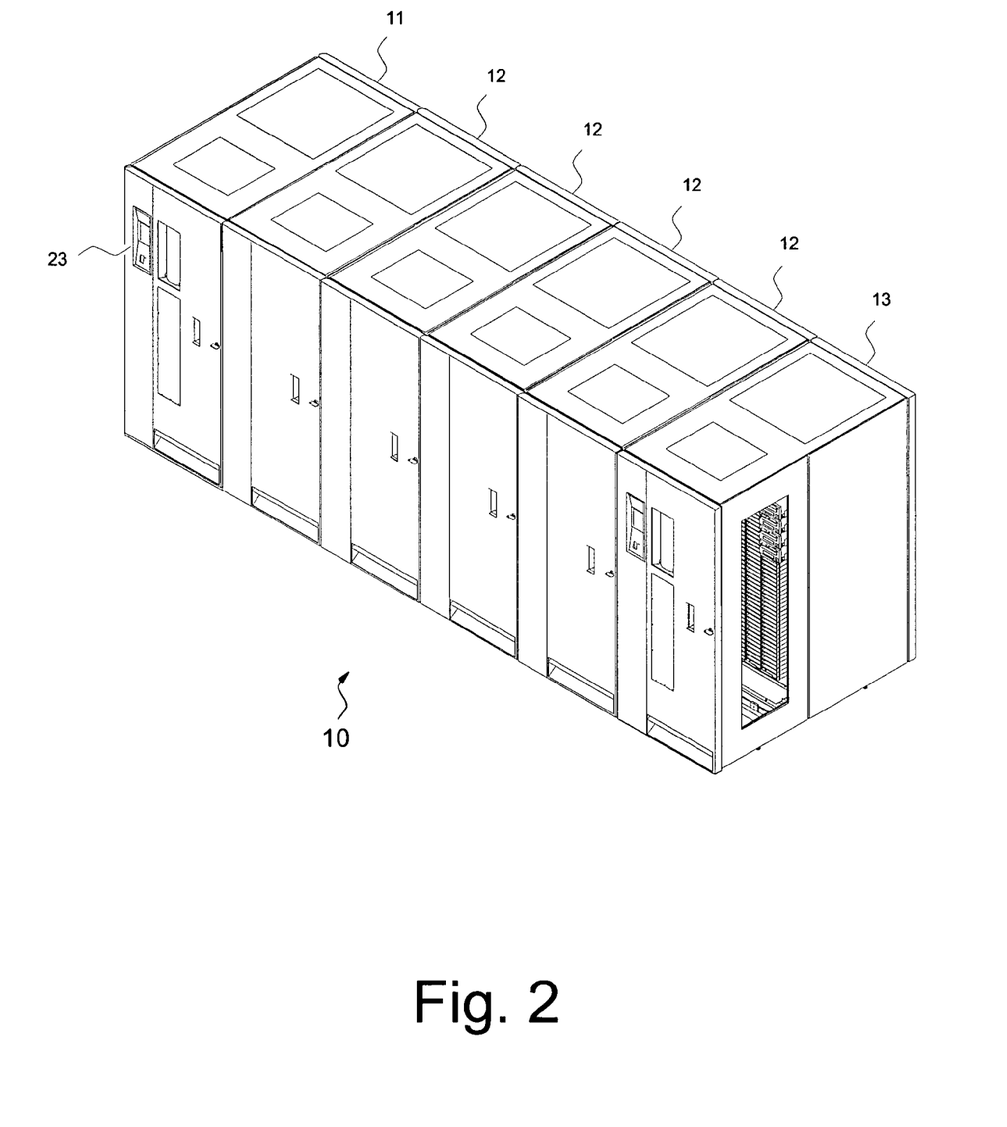
FIG. 2 illustrates an automated data storage library in which the present invention may be implemented.
Figure 3:
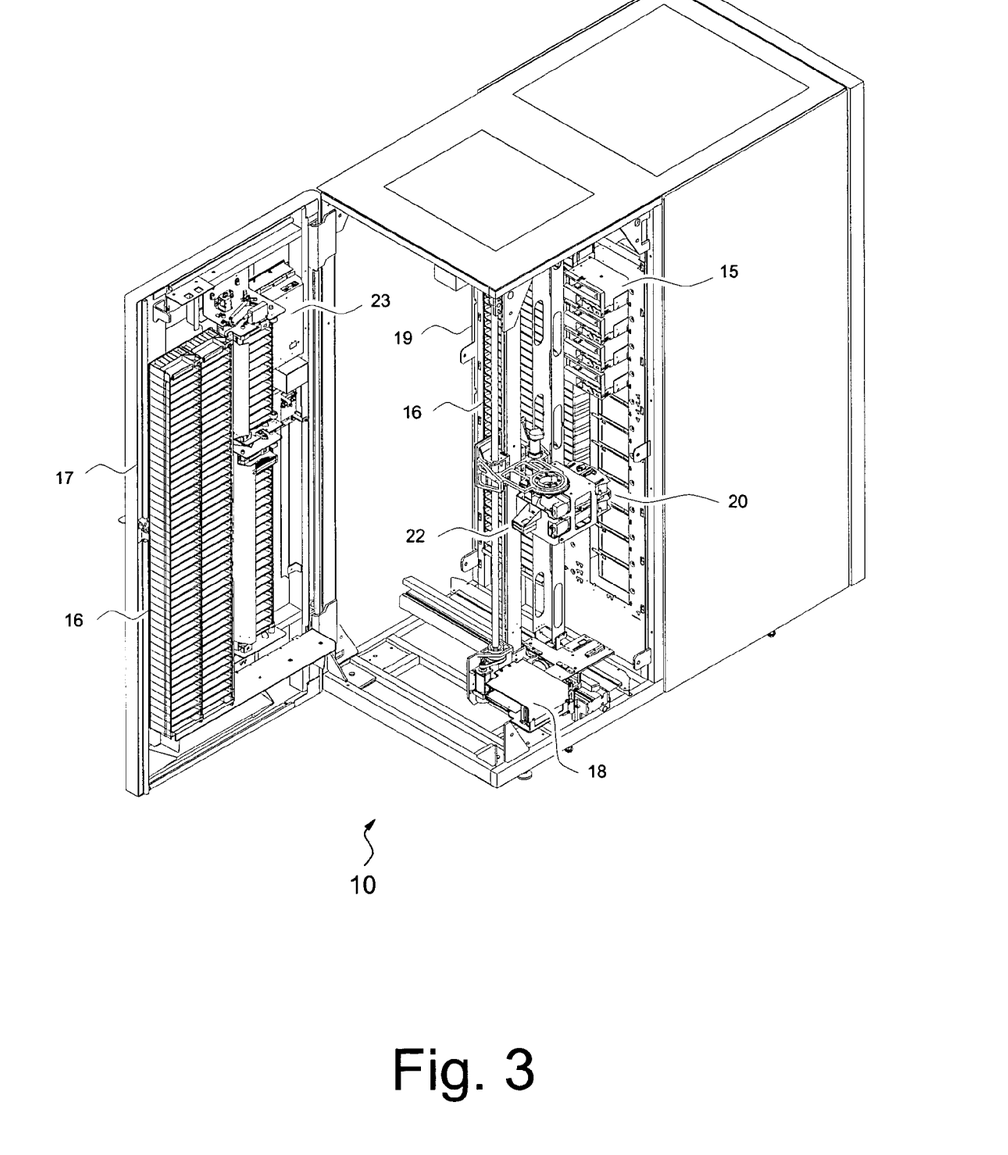
FIG. 3 illustrates one frame of the automated data storage library of FIG. 2.

FIGS. 2 and 3 illustrate an automated data storage library 10. The library is arranged for accessing data storage media (not shown) in response to commands from at least one external host system (not shown), and comprises storage shelves 16 on a front wall 17 and a rear wall 19 for storing data storage media. The library 10 further comprises at least one data storage drive 15 for reading and/or writing data with respect to the data storage media and at least one robot accessor 18 for transporting the data storage media between the storage shelves 16 and the data storage drive(s) 15. The data storage drives 15, for example, may be optical disk drives or magnetic tape drives, such as an IBM® LTO Ultrium Drive, and the data storage media may comprise optical or magnetic tape media, respectively, or any other removable media associated with corresponding drives. The library 10 may also comprise an operator panel 23 or other user interface, such as a web-based interface, which allows a user to interact with the library 10. Additionally, a control port (not shown) may be provided, which permits communications between a host and the library, e.g., for receiving commands from a host and forwarding the commands to the library, but which is not a data storage drive. The library 10 may comprise one or more frames 11, 12 and 13, each having storage shelves 16 accessible by the robot accessor 18. The robot accessor 18 comprises a gripper assembly 20 for gripping one or more data storage media and may also include a bar code scanner 22 or other reading system, such as a smart card reader, mounted on the gripper 20 to "read" identifying information about the data storage media.

Figure 4:
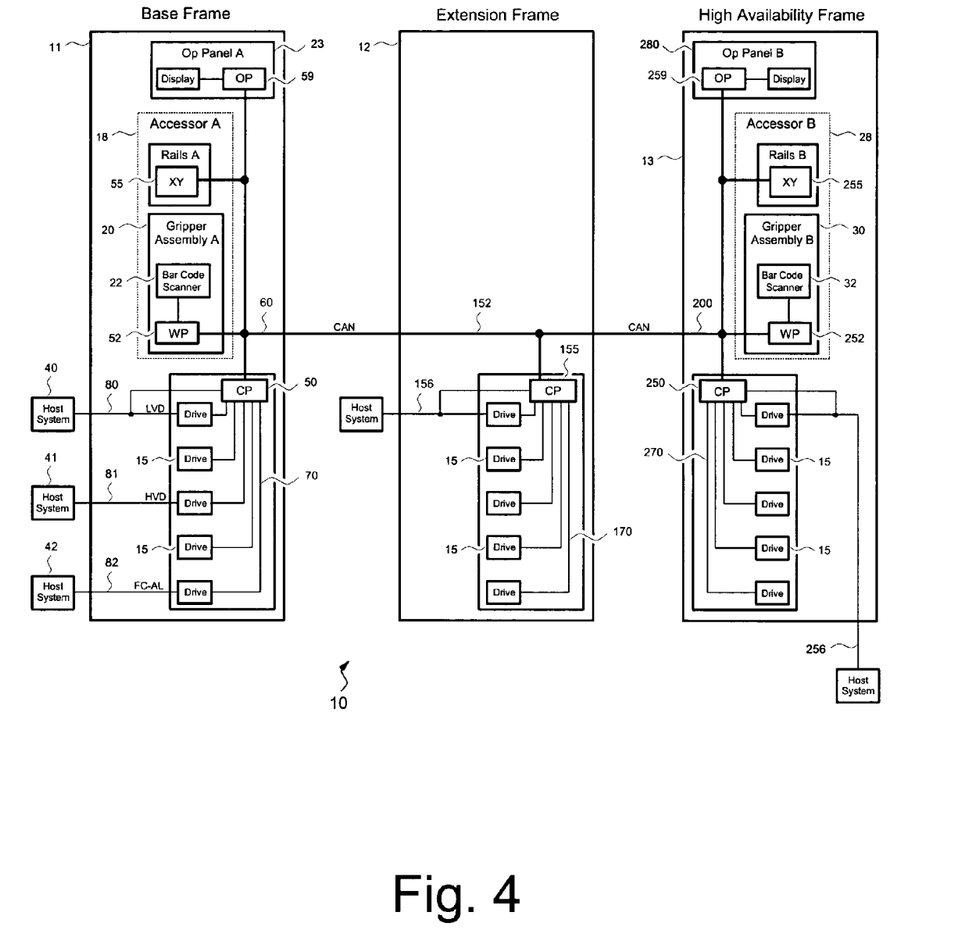
FIG. 4 illustrates a block diagram of one embodiment of a data storage library which employs a distributed system of modules and processor nodes.

FIG. 4 illustrates an embodiment of a data storage library 10 of FIGS. 2 and 3, which employs a distributed system of modules with a plurality of processor nodes. The term "processor node" as used herein may refer to a single library controller or may refer to one of many library controllers. An example of a data storage library 10 which may implement the present invention is the IBM 3584 UltraScalable Tape Library. The library 10 comprises a base frame 11 and may additionally comprise one or more extension frames 12 as well as a high availability frame 13.

The base frame 11 of the library 10 comprises one or more data storage drives 15, and a robot accessor 18. As previously described, the robot accessor 18 comprises a gripper assembly 20 and may include a reading system 22 to "read" identifying information about the data storage media. The extension frame 12 comprises additional storage shelves, and may comprise additional data storage drives 15. The high availability frame 13 may also comprise additional storage shelves, data storage drives 15 and a second robot accessor 28, which includes a gripper assembly 30 and may include a bar code scanner 32 or other reading device, and an operator panel 280 or other user interface. In the event of a failure or other unavailability of the robot accessor 18, or its gripper 20, etc., the second robot accessor 28 may take over.

In the exemplary library 10, each of the robot accessors 18, 28 moves its gripper in the horizontal "X" and vertical "Y" directions to retrieve and grip, or to deliver and release the data storage media at the storage shelves 16 and to load and unload the data storage media at the data storage drives 15.

The exemplary library 10 receives commands from one or more host systems 40, 41 or 42, such as host servers. The host systems 40, 41 and 42 communicate with the library directly, e.g., on path 80, through one or more control ports (not shown), or through one or more data storage drives 15 on paths 81, 82, providing commands to access particular data storage media and move the media, for example, between the storage shelves and the data storage drives. The commands are typically logical commands identifying the media and/or logical locations for accessing the media.

The exemplary library 10 may be controlled by a distributed control system receiving the logical commands from hosts, determining the required actions, and converting the actions to physical movements of the robot accessor 18, 28.

In the exemplary library 10, the distributed control system comprises processor nodes, each having one or more processors. In one example of a distributed control system, a communication processor node 50 may be located in the base frame 11. The communication processor node 50 provides a communication link for receiving the host commands, either directly or through the drives 15 via lines 70 or via at least one external interface, e.g., coupled to line 80.

The communication processor node 50 may additionally provide a communication link 70 for communicating with the data storage drives 15. The communication processor node 50 may be located in the frame 11, close to the data storage drives 15. Additionally, in an example of a distributed processor system, one or more additional work processor nodes are provided, which may comprise, e.g., a work processor node 52 that may be located at the robot accessor 18, and that is coupled to the communication processor node 50 via a network 60. Each work processor node may respond to received commands which are broadcast to the work processor nodes from any communication processor node, and the work processor node may also direct the operation of the robot accessor, providing move commands. An XY processor node 55 may be provided and may be located at an XY system of the robot accessor 18. The XY processor node 55 is coupled to the network 60, and is responsive to the move commands, operating the XY system to position the gripper 20.

Also, an operator panel processor node 59 may be provided at the operator panel 23 to provide an interface for communicating between the operator panel 23 and the communication processor node 50, the work processor node 52, and the XY processor node 55.

A network, for example comprising a common bus 60, is provided, coupling the various processor nodes. The network may comprise a robust wiring network, such as the commercially available CAN (Controller Area Network) bus system, which is a multi-drop network, having a standard access protocol and wiring standards, for example, as defined by CiA, the CAN in Automation Association, Am Weich Selgarten 26, D-91058 Erlangen, Germany. Other similar networks, such as Ethernet, or a wireless network system, such as RF or infrared, may be employed in the library.

The communication processor node 50 is coupled to each of the data storage drives 15 of the base frame 11, via lines 70, communicating with the drives and with host systems 40, 41 and 42. Alternatively, the host systems may be directly coupled to the communication processor node 50 at input 80, or to control port devices (not shown) which connect the library to the host system(s) with a library interface similar to the drive/library interface. Various communication arrangements may be employed for communication with the hosts and with the data storage drives. In the example of FIG. 4, host connections 80 and 81 are SCSI busses. The bus 82 comprises an example of a Fibre Channel-Arbitrated Loop which is a high speed serial data interface, allowing transmission over distances greater than those provided by SCSI bus systems.

The data storage drives 15 may be in close proximity to the communication processor node 50 and may employ a short distance communication scheme, such as SCSI, or a serial connection, such as RS-422. The data storage drives 15 may thus be individually coupled to the communication processor node 50 by means of lines 70.

An extension frame 12 may be provided and may be coupled by an extension network 152, into the network 60. Another communication processor node 155, similar to communication processor node 50, may be located in the extension frame 12 and may communicate with hosts, e.g., at input 156, and data storage drives 15 in extension frame 12, e.g., via lines 170. The communication processor node 155 is coupled to the network 152, 60 providing a communication link for the commands to the network 152, 60 so that the commands are linked to the base frame work processor node 52.

The communication processor node 155 may be mounted in the extension frame 12, closely adjacent to the coupled data storage drives 15 of the extension frame 12, communicating with the drives and with the attached host systems. The data storage drives 15 are also individually coupled to the communication processor node 155 by means of lines 170.

Additional extension frames with identical communication processor nodes 155, storage shelves, data storage drives 15, and extension networks 152, may be provided and each is coupled to the adjacent extension frame.

Further, the data storage library 10 may also comprise another robot accessor 28, for example, in a high availability frame 13. The robot accessor 28 may comprise a gripper 30 for accessing the data storage media, and an XY system 255 for moving the robot accessor. The high availability frame 13 may be adjacent an extension frame 12 or adjacent the base frame 11, and the robot accessor 28 may run on the same horizontal mechanical path as robot accessor 18 or on an adjacent path. The exemplary control system may additionally comprise an extension network 200 forming a network coupled to network 152 of an extension frame or to the network 60 of the base frame.

Figure 5:
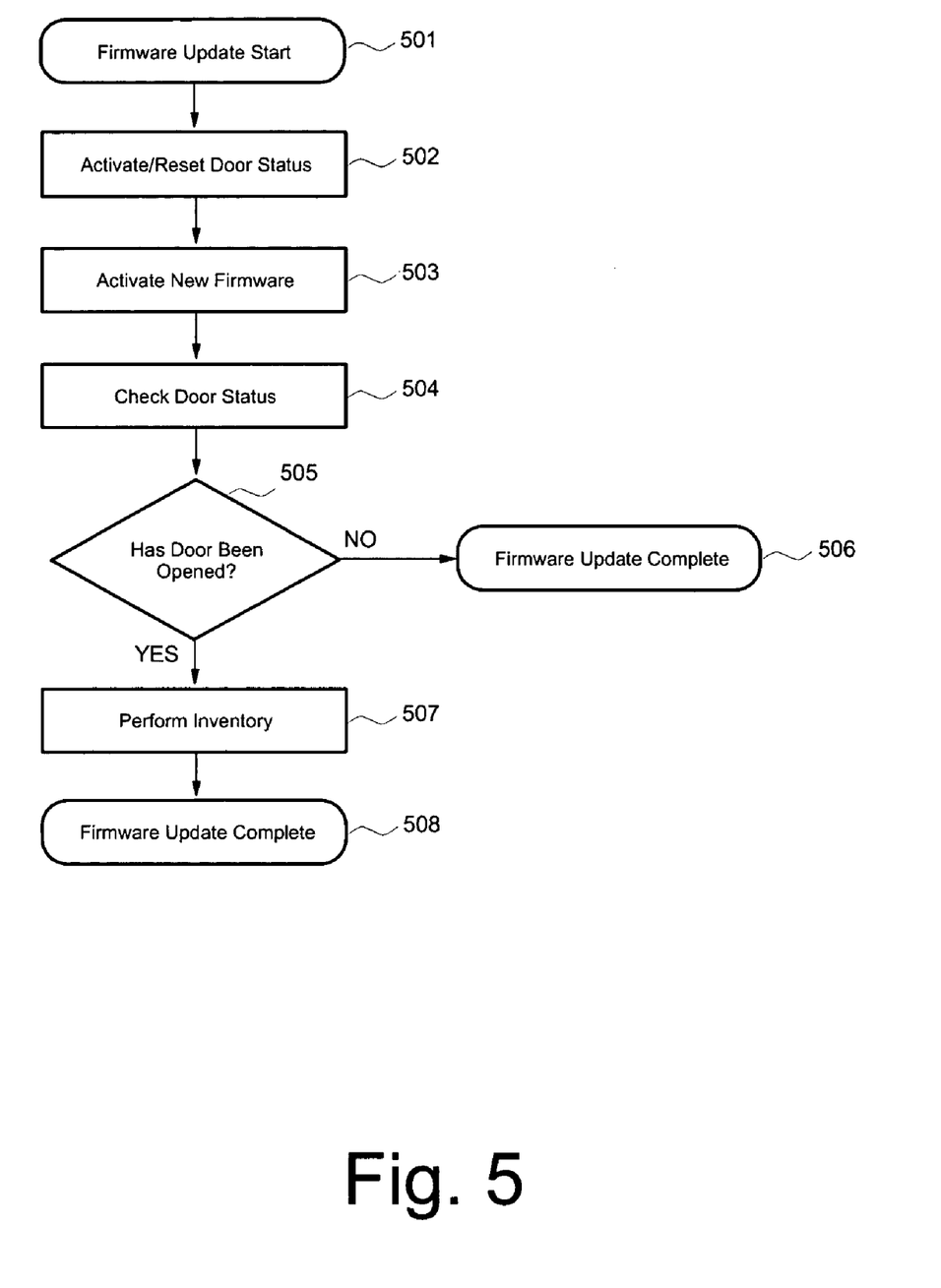
FIG. 5 is a flow chart of one embodiment of the present invention.

FIG. 5 illustrates the method of the first embodiment. A library firmware update (also referred to as a code update) begins in step 501. At some time before the new firmware update is activated, it may be desirable to activate or reset a door sense circuit in step 502, depending on the design of the door sense. For example, the door sense may comprise digital latches which store the open/closed status of a door. A reset may be required to clear a latch before the new firmware update image is activated. Without the reset, there may be an old indication of door status before the new firmware image is activated. Alternatively, a door sense circuit may need to be enabled or activated in order to properly monitor the door status. As used herein, "resetting" a door sense circuit may include resetting, initializing, activating or enabling the circuit. In step 503, the firmware update image is received, installed to non-volatile memory and activated. Activation may comprise a hardware or software reset of the processor(s), or it may comprise a jump, call or branch to an area of firmware which will allow the new firmware that has been updated to be executed. The door status is read in step 504. In the example of digital latches described above, this may comprise reading the state of the door status latches. If a door has not been opened and/or closed as indicated in step 505, then control moves to step 506 where the firmware update is complete. If no door has been opened and/or closed, there is no need to inventory the data storage media and a potentially disruptive inventory operation is avoided. If, on the other hand, a door has been opened and/or closed as indicated in step 505, then control moves to step 507 where the library controller performs an inventory of part or all of the library. For example, if the library controller can determine that a specific frame door has been opened and/or closed then it may only be necessary to inventory that single frame. Thus, because performing an inventory can be a disruptive operation, in this embodiment, it is performed only when necessary. The potential for disruption is reduced because only the contents of the affected frames are inventoried; therefore, the ability to determine which door(s) have been opened and/or closed is desirable. The firmware update is completed in step 508.

The steps of the flowchart of FIG. 5 may be executed by one or more library controllers. In addition, changes may be made to the flowchart without deviating from the spirit and scope of the invention. Herein, "controller", "library controller", "node" and "processor node" may be used interchangeably.

Figure 6:
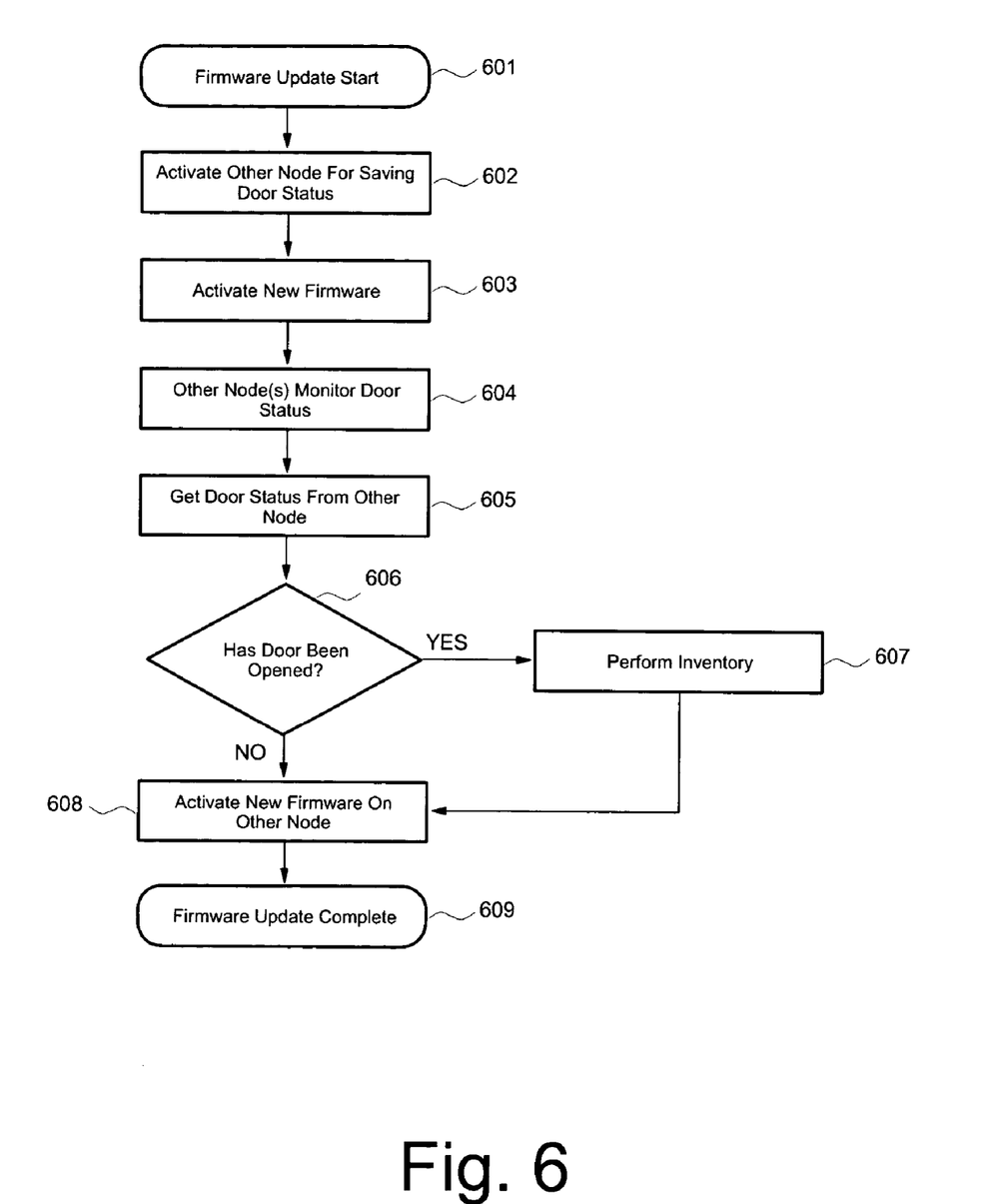
FIG. 6 is a flow chart of another embodiment of the present invention.

FIG. 6 illustrates the method of the second embodiment. A library firmware update begins in step 601. At some time before the new firmware update is activated, it may be desirable to activate a node to monitor door status and/or maintain a copy of the inventory data in step 602. For example, if the inventory data is volatile, activation of the new firmware update image may cause the data to be lost. Maintaining a copy of inventory data on a node which will not experience the activation of a new firmware image at the same time as other nodes will allow the data to be preserved for later restoration. Alternatively, the door status and/or inventory data may be maintained on another node at all times and step 602 may be eliminated. In step 603, the firmware update image is activated. This may comprise a hardware or software reset of the processor(s), or it may comprise a jump, call or branch to an area of firmware which will activate the new firmware that has been updated. While the firmware update image is activated at one or more nodes in step 603, one or more other nodes monitors door status in step 604 in the event that a door is opened and/or closed. The door status and/or inventory data is read in step 605. In step 605, door status and/or inventory data may be retrieved by one or more nodes on which the new firmware image was activated in step 603. The node that activated the firmware update image may request the door status from the node that was maintaining door status. Alternatively, the node that maintains the door status may provide it to the activating node without any overt request from the activating node. This could be accomplished by monitoring the activating node for an indication that it had just reset or activated a new firmware update. Continuing with FIG. 6, if a door has been opened and/or closed as indicated in step 606, then control moves to step 607 where the library controller performs an inventory of part or all of the library. For example, if the library controller can determine that a specific frame door has been opened and/or closed, then it may only be necessary to inventory that single frame. After performing the inventory of step 607, control moves to step 608.

If, on the other hand, a door has not been opened and/or closed as indicated in step 606, then control moves to step 608. If no door has been opened and/or closed, then there is no need to inventory the data storage media and a potentially disruptive inventory operation is avoided. At step 608, a new firmware update image may be activated in the node(s) which maintained door status and/or inventory data. This is an optional step because it may be desirable to maintain a different firmware image on this node(s) and which would require a different firmware update. Alternatively, this node may not be upgradeable or it may be desired to activate this node at some other time. The firmware update is completed in step 609.

The steps of the flowchart of FIG. 6 may be executed by one or more library controllers. In addition, changes may be made to the flowchart without deviating from the spirit and scope of the invention.

The objects of the invention have been fully realized through the embodiments disclosed herein. Those skilled in the art will appreciate that the various aspects of the invention may be achieved through different embodiments without departing from the essential function of the invention. The particular embodiments are illustrative and not meant to limit the scope of the invention as set forth in the following claims.

What is claimed is:

1. An automated data storage library for accessing data storage media in response to commands from at least one external host system, comprising:
   a housing unit having at least one access door;
   a plurality of storage shelves for storing data storage media within the housing unit;
   a data storage drive for reading and/or writing data to/from the data storage media;
   a robot accessor for transporting data storage media between the storage shelves and the data storage drive;
   a first processor node;
   means for activating a library firmware update image in the first processor node;
   means for determining a status of the at least one access door; and
   means for performing at least a partial inventory of the data storage media if the means for determining a status determines that at least one access door has been opened and/or closed while the library firmware update image was activated.

2. The automated data storage library of claim 1, further comprising:
   a second processor node;
   means associated with the second processor node for storing a copy of an inventory of the data storage media; and
   means for restoring the inventory from the second processor node to the first processor node after the library firmware update has been activated in the first processor node.

3. The automated data storage library of claim 2, further comprising means for activating the library firmware update image in the second processor node after the library firmware update has been activated in the first processor node.

4. The automated data storage library of claim 1, wherein the means for determining a status of the at least one access door comprises a second processor node.

5. The automated data storage library of claim 4, further comprising means for activating the library firmware update image in the second processor node after the library firmware update has been activated in the first processor node.

6. The automated data storage library of claim 1, further comprising means for resetting a door sense circuit prior to activating the firmware update in the first processor node.

7. The automated data storage library of claim 1, wherein the data storage media are members of the type of storage cartridges comprising optical discs, magnetic disks and magnetic tapes.

8. A method for updating a firmware image in an automated data storage library, the automated data storage library for accessing data storage media in response to commands from at least one external host system and having a housing unit having at least one access door, a plurality of storage shelves for storing data storage media within the housing unit, a data storage drive for reading and/or writing data to/from the data storage media, a robot accessor for transporting data storage media between one of the storage shelves and the data storage drive, and a first processor node operating from a current library firmware image, the method comprising:
   receiving a library firmware update;
   activating the library firmware update image in the first processor node;
   determining a status of the at least one access door; and
   performing at least a partial inventory of the data storage media if the means for determining a status determines that at least one access door has been opened and/or closed while the library firmware update image was activated.

9. The method of claim 8, further comprising:
   storing a copy of an inventory of the data storage media with a second processor node; and
   restoring the inventory to the first node after the library firmware update has been activated in the first processor node.

10. The method of claim 9, further comprising activating the library firmware update image in the second processor node after the library firmware update has been activated in the first processor node.

11. The method of claim 8, further comprising monitoring the status of the access door by a second processor node.

12. The method of claim 11, further comprising activating the library firmware update image in the second processor node after the library firmware update has been activated in the first processor node.

13. The method of claim 8, further comprising resetting a door sense circuit prior to activating the firmware update in the first processor node.

14. A computer program product of a computer readable medium usable with a programmable computer, the computer program product having computer-readable code embodied therein for updating a firmware image in an automated data storage library, the automated data storage library for accessing data storage media in response to commands from at least one external host system and having a housing unit having at least one access door, a plurality of storage shelves for storing data storage media within the housing unit, a data storage drive for reading and/or writing data to/from the data storage media, a robot accessor for transporting data storage media between one of the storage shelves and the data storage drive, and a first processor node operating from a current library firmware image, the computer-readable code comprising instructions for:
   receiving a library firmware update;
   activating the library firmware update image in the first processor node;

determining a status of the at least one access door; and performing at least a partial inventory of the data storage media if the means for determining a status determines that at least one access door has been opened and/or closed while the library firmware update image was activated.

15. The computer program product of claim 14, further comprising instructions for:

storing a copy of an inventory of the data storage media with a second processor node; and restoring the inventory to the first node after the library firmware update has been activated in the first processor node.

16. The computer program product of claim 15, further comprising instructions for activating the library firmware update image in the second processor node after the library firmware update has been activated in the first processor node.

17. The computer program product of claim 14, further comprising instructions for monitoring the status of the access door by a second processor node.

18. The computer program product of claim 17, further comprising instructions for activating the library firmware update image in the second processor node after the library firmware update has been activated in the first processor node.

19. The computer program product of claim 14, further comprising instructions for resetting a door sense circuit prior activating the firmware update in the first processor node.

* * * * *